US 6,642,126 B2

(12) United States Patent
Igel

(10) Patent No.: US 6,642,126 B2
(45) Date of Patent: Nov. 4, 2003

(54) PROCESS FOR MANUFACTURING A SEMICONDUCTOR WAFER WITH PASSIVATION LAYER MASK FOR ETCHING WITH MECHANICAL REMOVAL

(75) Inventor: Günter Igel, Teningen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/745,090

(22) Filed: Dec. 21, 2000

(65) Prior Publication Data

US 2001/0018232 A1 Aug. 30, 2001

(30) Foreign Application Priority Data

Dec. 22, 1999 (DE) .......................................... 199 62 431

(51) Int. Cl.⁷ ........................ H01L 21/301; H01L 21/46; H01L 21/78
(52) U.S. Cl. ........................ 438/460; 438/462; 438/928
(58) Field of Search ................................ 438/460, 462, 438/700, 928, 465

(56) References Cited

U.S. PATENT DOCUMENTS

| | | | | |
|---|---|---|---|---|
| 3,627,647 A | * | 12/1971 | Reuter et al. ................ 205/123 |
| 3,775,200 A | * | 11/1973 | de Nobel et al. ........... 257/481 |
| 4,424,271 A | | 1/1984 | Keel et al. |
| 4,729,971 A | * | 3/1988 | Coleman .................... 438/462 |
| 5,073,230 A | * | 12/1991 | Maracas et al. ............ 117/915 |
| 5,300,172 A | | 4/1994 | Ishiwata et al. |
| 5,480,842 A | * | 1/1996 | Clifton et al. .............. 257/679 |
| 5,482,899 A | * | 1/1996 | McKenna et al. .......... 156/344 |
| 5,520,297 A | * | 5/1996 | Kagami et al. ............. 216/12 |
| 5,641,714 A | * | 6/1997 | Yamanaka ........... 148/DIG. 28 |
| 5,888,883 A | * | 3/1999 | Sasaki et al. ............... 438/460 |
| 5,904,548 A | * | 5/1999 | Orcutt ........................ 438/460 |
| 6,013,534 A | * | 1/2000 | Mountain ..................... 438/15 |
| 6,214,733 B1 | * | 4/2001 | Sickmiller .................. 438/458 |
| 6,337,258 B1 | * | 1/2002 | Nakayoshi et al. ......... 438/461 |
| 6,342,434 B1 | * | 1/2002 | Miyamoto et al. .......... 438/113 |
| 2001/0001215 A1 | * | 5/2001 | Siniaguine et al. ......... 257/618 |
| 2002/0013061 A1 | * | 1/2002 | Siniaguine et al. ......... 438/706 |

FOREIGN PATENT DOCUMENTS

| | | |
|---|---|---|
| DE | 19641777 A1 | 4/1998 |
| DE | 19650821 A1 | 6/1998 |

OTHER PUBLICATIONS

Scanning Probe Sharp Tip Formation For IC Integration Using Mesa Technique Microelectronic Engineering 35 (1997) pp. 329–332.

* cited by examiner

Primary Examiner—John F. Niebling
Assistant Examiner—Angel Roman
(74) Attorney, Agent, or Firm—Volpe and Koenig, P.C.

(57) ABSTRACT

A process for manufacturing a semiconductor arrangement (3), whereby in particular a wafer (1) with a large number of semiconductor arrangements forming chips (7) is manufactured, and the wafer is divided afterward, and in this way the semiconductor arrangements are separated. At least one region of a wafer side is covered by a passivation layer (9) during the etching of the remaining wafer area. After etching, the passivation layer (9) is removed. At least in an outer edge region of the wafer, if need be additionally in the shape of the wafer front side, outside the active chip surface and especially in the regions bounding the respective chip systems, adhesion zones (8) for the passivation layer (9) are created which enter into a sealing, and in particular a chemical combination with the material used for the passivation layer. Outside the adhesion zones, a diminished ability to adhere is present, so that the passivation layer (9), for example following the reverse side etching in the area lying outside the adhesion zones (8), can be removed from the wafer surface mechanically by one of a liquid stream, a gas stream, and by being acted upon by ultrasound.

16 Claims, 1 Drawing Sheet

PROCESS FOR MANUFACTURING A SEMICONDUCTOR WAFER WITH PASSIVATION LAYER MASK FOR ETCHING WITH MECHANICAL REMOVAL

BACKGROUND

The invention relates to a process for manufacturing a semiconductor arrangement, whereby in particular a wafer with a great number of semiconductor arrangements forming chips is produced, the wafer is thereafter partitioned, and in this way the semiconductor arrangements are separated, whereby at least one region of a wafer side is covered during etching of the remaining area by means of a passivation layer, and whereby the passivation layer is removed after the etching.

Providing a silicon plate with a passivation layer in order to protect these layers against an etching agent is already known from DE 196 50 821 A1. Moreover, the region to be protected is provided with a coating which has a predominant proportion of benzocyclobutene. Furthermore, an adhesion mediator of aminopropylsilane can be additionally provided. After etching of the areas lying outside the passivation layer, the passivation layer is removed, which takes place with the aid of a solvent, in particular nitric acid. Alternatively, a passivation layer can also be acted upon and removed with an oxygen plasma.

The use of solvents is disadvantageous for environmental reasons and based on cost. Moreover, it is problematic that upon removing the solvent, residues are deposited at places where it is not desired, for example at contact points. This would have a negative influence upon soldering or contacting processes.

Even removing the passivation layer by means of an oxygen plasma is costly. Even if the passivation layer can remain on the wafer, it nonetheless must be partially removed in order to expose the contact pads. Then a photolithography step is necessary for this, however, which requires a corresponding additional expense.

Procedures are also known in connection with which the wafers can be etched on one side without the side not to be etched being coated with a passivation layer. By way of example, this can take place with a so-named etching can which covers a wafer with a tight fit on one side. The necessary sealing pressure puts a mechanical stress upon the wafer so that precisely with wafer structures having thin areas, there exists the danger of the wafer breaking. Etching machines for this one-sided etching are expensive, and use of these is also avoided for technical reasons.

SUMMARY

The object of the present invention is to provide a process for simple passivation of a wafer region or of a wafer side for protection against etching solutions in connection with which the disadvantages of the state of the art are avoided and whereby especially environmentally harmful and/or expensive processes and agents are avoided.

It is proposed as a realization of this object that at least in one outer edge region of the wafer, an adhesion zone for the passivation layer is created which enters into a sealing, in particular chemical combination with the material used for the passivation layer, and that the passivation layer is removed mechanically at least in the area lying outside the adhesion zones.

Through the adhesion zones created at predetermined spots, a sealing, durable bonding takes place at these points in connection with applying the passivation or protection layer, in particular through the chemical combination taking place in these adhesion regions between adhesion zone and passivation layer, while the remaining areas covered by the passivation layer have a diminished adhesion to the passivation layer to the extent that a subsequent removal of the passivation layer is possible with little expenditure and especially without solvent.

While a circular adhesion zone provided only in the edge region of the wafer can suffice, especially with wafers with a small diameter, with wafers with a larger area it is appropriate to provide adhesion zones within the surface covered over by the passivation layer as well in order to provide additional stabilization of the passivation layer.

Also in the outer edge area of the wafer, according to another configuration of the invention, in particular in the shape of the front side of the wafer, outside the active chip zones, further adhesion zones can also be created in an area bounding the respective chip systems.

In this way, on the one hand the additional stabilization of the passivation layer is realized, and moreover, partial regions of a wafer side can also be thus protected by the passivation layer.

A preferred application is provided in connection with a reverse side etching of the wafer, for example, for manufacturing pressure sensors. Here the wafer front side having the chip systems is covered with the passivation layer.

An independent solution for implementing this in accordance with the invention provides that, outside the active chip surface in the areas bounding the respective chip systems, adhesion zones are created which enter into a sealing, especially a chemical combination, with the material used for the passivation layer, and that the passivation layer is mechanically removed at least in the area lying outside the adhesion zones.

With this process, all active chip surfaces are individually bounded by adhesion zones. With these adhesion zones, a sealing compound forms upon applying the passivation layer so that all chips are well protected and the passivation layer is stably connected with the wafer through the numerous adhesion sites.

Appropriately, the adhesion zones are created in the separation region between the individual chips, preferably by removing a layer down to the substrate coat. The separation areas are consequently at the same time used as adhesion zones, and in this way, no additional chip surface is necessary.

In connection with this, it is advantageous if the adhesion zones in the separation area are applied with a greater breadth than the breadth of the saw cut for separating the wafer. After removing the passivation layer, residues are left in the adhesion zones which are only partially removed by the saw cut when dividing the wafer. The residues of the passivation layer adhering to the saw path, which in this state cause no technical disturbance, can serve for assuring originality and origin.

Preferably a noble metal, for example palladium, if need be with an additional outer protective layer, for example of gold, is applied to the areas to be protected.

A passivation layer of noble metals enters into a chemical compound with silicon, and in this way adheres especially well in the area of the adhesion zones provided. In the event that an etching agent aggressive in relation to the noble metal, for example, palladium, must be used, the noble metal layer can also be provided with a protective layer resistant in relation to the etching agent, for example of gold.

Applying a metal layer of palladium to a MOS arrangement is indeed known from DE 196 41 777 A1. This metal layer nonetheless serves to form metal electrodes or contact pads, thus active or normal use areas, while the really undesired area of the metal layer situated outside the metal electrodes and contact pads has no technical function, and for this reason is removed after manufacturing the metal electrodes and contact pads.

A configuration of the invention provides that adhesion zones are created when structuring the standard chip passivation, especially by removing an oxide layer. Here the adhesion zones can be exposed at the same time as the available contact pads are exposed when etched free. The etching stops at the contact pads especially consisting of aluminum, while it goes further up to the silicon of the substrate in the region of the adhesion zones provided.

There also exists the possibility, however, that, with the application of the passivation layer, at the same time contact pads or similar metallic contact points are formed. In such contact point areas, polysilicon is as a rule present as a substrate which enters into a good adhesive combination with the passivation layer of metal, preferably palladium, so that in this case even the adhesion zones form contact point areas.

If the passivation layer is removed, it then remains preserved in the adhesion zones and forms metallic contact pads in connection with the previously mentioned contact points.

It should also be mentioned that at least the adhesion zones in the area of the saw path can also be created by mechanical abrasion in the oxide layer situated there.

The passivation layer can also be removed following etching of the areas not covered, especially following a reverse side etching, from the wafer surface, whereby subsequently the wafer is divided into separation areas forming preferably adhesion zones. There also, however, exists the possibility that the passivation element is removed from the wafer surface following reverse side etching at the same time as the division of the wafer.

Removing the passivation layer takes place mechanically, since it is removed by a liquid stream and/or by a gas stream and/or by being acted upon by ultrasound from the wafer surface or the chip surfaces.

These mechanical separation procedures make possible a solvent-free, environmentally friendly removal whereby the passivation layer is reliably removed from the regions lying outside the adhesion zones, and moreover a separation from the better adhering passivation layer regions takes place in the adhesion zones.

If the removal of the passivation layer is undertaken when dividing the wafer, the passivation layer can be removed by the liquid introduced for sawing at appropriate pressure. This can also take place with the aid of additional measures, for example, compressed air, ultrasound and the like.

Additional configurations of the invention are presented in the further dependent claims.

BRIEF DESCRIPTION OF THE DRAWINGS

A preferred embodiment of the invention is explained in detail below on the basis of the drawings. In the drawings.

DETAILED DESCRIPTION OF THE PREFERRED EMBODIMENT

Figure 1:
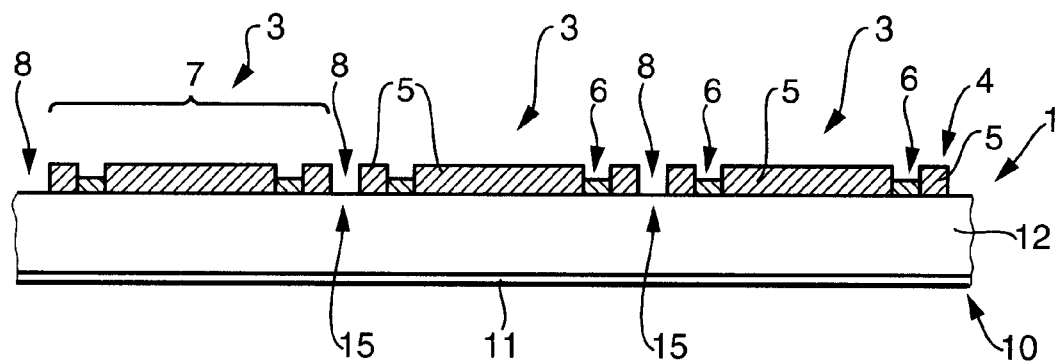
FIG. 1 shows a wafer section with several chip areas.
Figure 2:
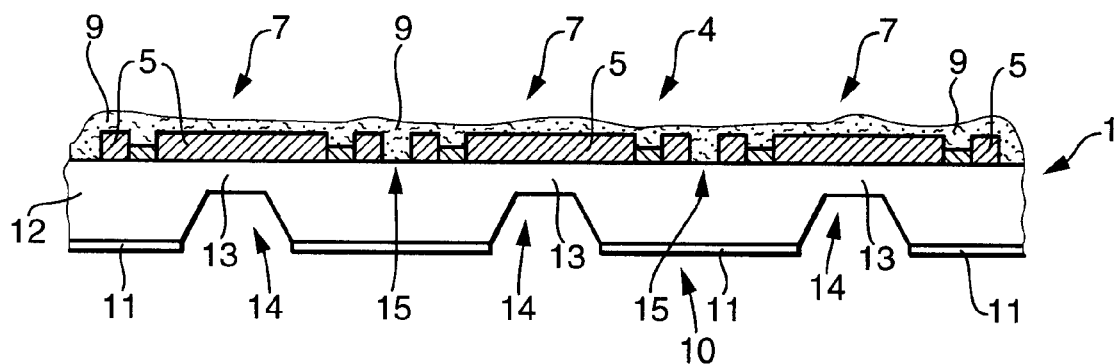
FIG. 2 is a schematic representation similar to FIG. 1, in which a passivation layer is applied to the upper side and depressions etched into the reverse side.
Figure 3:
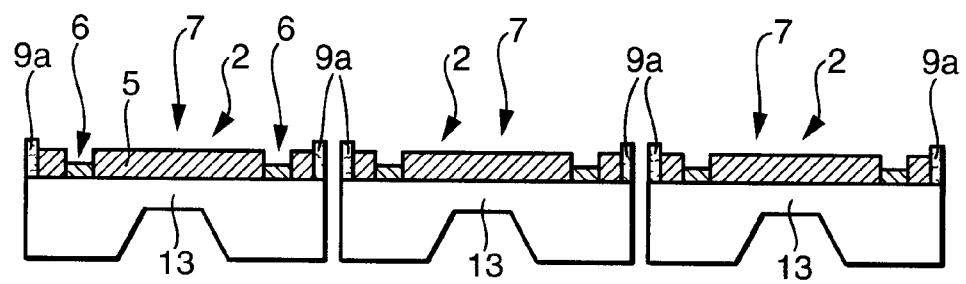
FIG. 3 is a schematic representation of individual chips after removal of the passivation layer and separation.

FIGS. 1 to 3 show three phases of a process for manufacturing pressure sensors. In FIG. 1 there is shown a section of a wafer 1 with three semiconductor arrangements 3 belonging in each case to a subsequent pressure sensor 2 (FIG. 3), of which in the figures only the oxide layer 5 applied to the front side of the wafer 4 as well as the contact pads 6 standing in contact with diffused in resistors is represented.

In addition to the semiconductor arrangements forming a chip 7 in each case, in which the base material of the wafer, as a rule silicon, is exposed. These adhesion zones 8 can at the same time be created when the contact pads 6 are etched free, since the mask for the contact pads 6 at the same time is also constructed for manufacturing the adhesion zones 8. During the etching process, the oxide layer 5 is etched free in the region of the contact pads 6 up to the metal coating, usually of aluminum, and stops there, while in the region of the adhesion zones 8, the oxide layer 5 is etched away down to the substrate material of the wafer.

As is recognizable in FIG. 2, the wafer front side 4 is subsequently covered with a passivation layer which is preferably made of a noble metal. The passivation layer 9 forms with the substrate material of the wafer in the areas of the adhesion zones 8, a well adhering compound, while on the remaining, covered areas of the wafer surface, no durable compound arises.

The reverse side 10 of the wafer 1 is provided with an etching mask 11 in order to be able to etch, in provided membrane areas 13, depressions 14 into the wafer substrate 12 (FIG. 2). During this etching process, the wafer front side 4 is protected by the passivation layer 9.

In a following operation after the etching, the passivation layer 9 is removed so that the contact pads 6 are freely accessible for applying connections. Since the passivation layer 9 has only entered into a durable adhering combination with the wafer front side 4 in the adhesion zones 8, the remaining portions of the passivation layer 9, especially those covering over the individual chips 7, can easily be removed. In these areas, there arise only slight adhesion properties since the metallic passivation layer 9 does not form any chemical compound on the oxide layer 5, nor on the aluminum contact pads 6. In this way, there exists the possibility of removing these parts of the passivation layer 9 by mechanical action, which can, by way of example, take place by rinsing with water.

In order to promote the loosening of the passivation layer 9, being acted upon by ultrasound can also be provided as a mechanical action, whereby with the aid of water, a secure and at the same time gentle loosening of the passivation layer 9 is possible.

In order to promote the loosening of the passivation layer 9, this can be treated with a hydrogen-containing gas prior to removal.

The adhesion zones 8 outside the active chip surface are appropriately so positioned that they lie in the separation areas 15 in which the wafer is severed and the individual chips are separated. Residues of the passivation layer 9 adhering in these regions are removed either by the saw cut, or, however, if the saw path is narrower that the respective adhesion region 8, small residues 9a of the passivation layer 9 remain sticking on both sides of the saw path, as is well recognizable in FIG. 3. Therewith, securing originality and origin is possible, and even if these residues are etched away, it can then be demonstrated on the etching traces present that the operation occurred according to the process of the invention. The residues 9a of the passivation layer do not form any functioning elements and consequently do not impair the technical functioning of the chips.

Removal of the passivation layer 9 can take place in the manufacturing phase shown in FIG. 2 or if need be also at the same time as the separation of the wafer 1 into the individual chips.

What is claimed is:

1. A process for manufacturing a semiconductor arrangement (3), whereby a wafer (1) with a large number of semiconductor arrangements forming individual chips (7) is manufactured, and the wafer is subsequently divided, and in this way the semiconductor arrangements are separated, comprising: covering at least one region of a wafer side during etching of a remaining wafer area by a passivation layer (9), and removing the passivation layer after etching, further comprising forming an adhesion zone (8) for the passivation layer (9) which enters into a sealing and well adhering combination with a material used for the passivation layer (9), at least in one outer edge area of the wafer (1), and mechanically removing the passivation layer (9) after etching, at least in an area lying outside the adhesion zone (8), wherein the region covered when applying the passivation layer (9) has poorer adhesion characteristics in comparison with the passivation layer than the material present in the adhesion layers (8).

2. A process according to claim 1, further comprising, forming further adhesion zones (8) in a region bounding respective chip systems outside an active chip surface, in addition to the adhesion zone (8) created in an outer edge region of the wafer (1) for the passivation layer (9).

3. A process according to claim 1, whereby a front side having the chip system is covered during a reverse side etching by the passivation layer (9), and outside active chip surfaces in regions bounding respective chip systems, creating further adhesion zones (8) for the passivation layer (9) which enters into a sealing chemical combination with the material used for the passivation layer.

4. A process according to claim 1, wherein further adhesion zones (8) are created in a separation area (15) between the individual chips (7) by cutting down to a substrate layer.

5. A process according to claim 4, wherein the adhesion zones in the separation area (15) between the individual chips (7) are inserted with a greater breadth than a breadth of a saw cut for separating the wafer.

6. A process according to claim 1, wherein a noble metal is provided as the passivation layer (9), and an outer layer is applied to the at least one region of the wafer to be protected.

7. A process according to claim 1, wherein the adhesion zone (8) is created during a standard chip passivation by removing an oxide layer (5).

8. A process according to claim 1, wherein the passivation layer (9) is applied by vapor deposition or by galvanic separation.

9. A process according to claim 1, wherein with the application of the passivation layer (9), at the same time contact pads (6) and similar contact points are formed.

10. A process according to claim 1, wherein the passivation layer (9) is removed from the wafer surface following etching in one or several regions not covered by the passivation layer, and subsequently the wafer is divided at separation areas (15) forming the adhesion zones (8).

11. A process according to claim 1, wherein the passivation layer (9) is removed from the wafer surface after reverse side etching simultaneously with division of the wafer.

12. A process according to claim 1, wherein the passivation layer (9) is mechanically removed from the wafer surface or the chip surfaces by at least one of a liquid stream, a gas stream, and by action of ultrasound.

13. A process according to claim 1, wherein the passivation layer (9), priorremoval, is treated with a hydrogen-containing gas.

14. A process according to claim 1, wherein regions of the chips lying outside the adhesion zone (8), prior to applying the passivation layer (9), are provided with a coating, which has poorer adhesion characteristics than material situated in the adhesion zones (8).

15. A process of claim 14, wherein the coating is an oxide.

16. A process of claim 15, wherein the coating is silicon dioxide (5).

* * * * *

UNITED STATES PATENT AND TRADEMARK OFFICE
CERTIFICATE OF CORRECTION

PATENT NO. : 6,642,126 B2
DATED : November 4, 2003
INVENTOR(S) : Günter Igel

It is certified that error appears in the above-identified patent and that said Letters Patent is hereby corrected as shown below:

Column 6,
Line 31, after the phrase "layer (9)," delete "priorremoval" and insert therfor
-- prior to removal --.

Signed and Sealed this

Thirteenth Day of April, 2004

JON W. DUDAS
*Acting Director of the United States Patent and Trademark Office*